US012095005B2

(12) United States Patent
Kim et al.

(10) Patent No.: US 12,095,005 B2
(45) Date of Patent: Sep. 17, 2024

(54) NANOROD SEMICONDUCTOR LAYER HAVING FLAT UPPER SURFACE, MICRO-LED INCLUDING THE NANOROD SEMICONDUCTOR LAYER, PIXEL PLATE INCLUDING MICRO-LED, DISPLAY DEVICE INCLUDING THE PIXEL PLATE, AND ELECTRONIC DEVICES INCLUDING THE PIXEL PLATE

(71) Applicant: SAMSUNG ELECTRONICS CO., LTD., Suwon-si (KR)

(72) Inventors: Nakhyun Kim, Yongin-si (KR); Junhee Choi, Seongnam-si (KR); Jinjoo Park, Yongin-si (KR); Joohun Han, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/200,399

(22) Filed: May 22, 2023

(65) Prior Publication Data
US 2023/0290904 A1    Sep. 14, 2023

Related U.S. Application Data

(63) Continuation of application No. 17/106,515, filed on Nov. 30, 2020, now Pat. No. 11,688,827.

(30) Foreign Application Priority Data

Jun. 16, 2020    (KR) .................. 10-2020-0073245

(51) Int. Cl.
*H01L 33/24*    (2010.01)
*H01L 25/075*    (2006.01)
(Continued)

(52) U.S. Cl.
CPC .......... *H01L 33/24* (2013.01); *H01L 25/0753* (2013.01); *H01L 25/167* (2013.01);
(Continued)

(58) Field of Classification Search
CPC . H01L 33/24; H01L 25/0753; H01L 29/0676; H01L 33/32; H01L 33/44
See application file for complete search history.

(56) References Cited

U.S. PATENT DOCUMENTS 8,062,967 B1    11/2011    Scher et al.
8,455,284 B2    6/2013    Seong et al.
(Continued)

FOREIGN PATENT DOCUMENTS

FR    3098013 A1    1/2021
KR    10-2016-0027431 A    3/2016
WO    WO-2020260549 A1 * 12/2020 ......... H01L 25/0753

OTHER PUBLICATIONS

Gruart et al., WO2020260549A1 machine translation, 2020 (Year: 2020).*

*Primary Examiner* — Tracie Y Green
(74) *Attorney, Agent, or Firm* — CANTOR COLBURN LLP

(57) ABSTRACT

A nanorod semiconductor layer having a flat upper surface, a micro-LED including the nanorod semiconductor layer, a pixel plate including the micro-LED , a display device including the pixel plate, and an electronic device including the pixel plate are provided. The nanorod semiconductor layer includes: a main body; and an upper end formed from the main body, wherein the upper end includes: a first inclined surface; a second inclined surface facing the first inclined surface; and a flat upper surface between the first inclined surface and the second inclined surface, and a width of the upper end becomes narrower in an upward direction, and when a length of the upper end protruded from the main (Continued)

body (a thickness of the upper end) is L1, an inclination angle between a surface extending parallel to a surface selected from the first and second inclined surfaces and the flat upper surface is β, and a width of the main body is D, a width D1 of the flat upper surface satisfies Equation 1.

$$D1 = D - (2 \times L1 \times \tan\beta) \qquad \text{<Equation 1>}$$

18 Claims, 15 Drawing Sheets

(51) Int. Cl.
    *H01L 25/16*     (2023.01)
    *H01L 29/06*     (2006.01)
    *H01L 33/32*     (2010.01)
    *H01L 33/44*     (2010.01)

(52) U.S. Cl.
    CPC .......... *H01L 29/0676* (2013.01); *H01L 33/32* (2013.01); *H01L 33/44* (2013.01)

(56) References Cited

U.S. PATENT DOCUMENTS

| | | |
|---|---|---|
| 8,735,867 B2 | 5/2014 | Seong et al. |
| 8,835,903 B2 | 9/2014 | Gwo et al. |
| 9,385,266 B2 | 7/2016 | Cha et al. |
| 9,537,051 B2 | 1/2017 | Cha et al. |
| 9,748,438 B2 | 8/2017 | Kim et al. |
| 10,304,992 B2 | 5/2019 | Ohlsson et al. |
| 11,688,827 B2* | 6/2023 | Kim ...................... H01L 25/167 |
| | | 361/807 |
| 2011/0215295 A1 | 9/2011 | Lugauer |
| 2015/0325745 A1 | 11/2015 | Hwang |
| 2019/0335553 A1* | 10/2019 | Ahmed .................... G09G 3/32 |
| 2020/0135982 A1* | 4/2020 | Choi ...................... H01L 33/00 |
| 2021/0296533 A1 | 9/2021 | Tang |
| 2022/0037572 A1 | 2/2022 | Ahmed |
| 2022/0238495 A1 | 7/2022 | Gruart |

\* cited by examiner

NANOROD SEMICONDUCTOR LAYER HAVING FLAT UPPER SURFACE, MICRO-LED INCLUDING THE NANOROD SEMICONDUCTOR LAYER, PIXEL PLATE INCLUDING MICRO-LED, DISPLAY DEVICE INCLUDING THE PIXEL PLATE, AND ELECTRONIC DEVICES INCLUDING THE PIXEL PLATE

CROSS-REFERENCE TO RELATED APPLICATION

This application is a continuation of U.S. application Ser. No. 17/106,515, filed Nov. 30, 2020, which claims is based on and claims priority under 35 U.S.C. § 119 to Korean Patent Application No. 10-2020-0073245, filed on Jun. 16, 2020, in the Korean Intellectual Property Office, the disclosure of which is incorporated by reference herein in its entirety.

BACKGROUND

1. Field

The disclosure relates to nano-sized structures, and more particularly, to nanorod structures having a flat upper surface, micro-LEDs including the nanorod structures, pixel plates including the micro-LEDs, display devices including the pixel plates, and electronic devices including the pixel plates.

2. Description of Related Art

Various semiconductor materials are used in semiconductor devices. The quality of a semiconductor material used in a semiconductor device may affect the operating characteristics and efficiency of the semiconductor device. For example, the light emission efficiency of a light-emitting device may be closely related to the quality (thickness uniformity, composition uniformity, etc.) of a semiconductor layer used. Therefore, research to improve the quality of semiconductor materials used in semiconductor devices has been actively conducted.

SUMMARY

Provided are high-quality nanorod semiconductor layers that have a flat upper surface.

Provided are micro-LEDs that increase uniformity of thickness and composition of the active layer (light-emitting layer) due to use of the nanorod semiconductor layer.

Provided are pixel plates including the micro-LEDs as light-emitting elements.

Provided are display devices and electronic devices including the pixel plates.

Additional aspects will be set forth in part in the description which follows and, in part, will be apparent from the description, or may be learned by practice of the presented embodiments of the disclosure.

In accordance with an aspect of the disclosure, a nanorod semiconductor layer includes a main body; and an upper end connected to an upper part of the main body, wherein the upper end includes a first inclined surface; a second inclined surface; and a flat upper surface between the first inclined surface and the second inclined surface, wherein a width of the upper end becomes narrower in an upward direction away from the main body, and wherein when a thickness of the upper end in the upward direction is L1, an inclination angle between the flat upper surface and a surface extending parallel to a surface selected from the first inclined surface and the second inclined surface is $\beta$, and a width of the main body is D, a width D1 of the flat upper surface satisfies the following equation:

$$D1 = D - (2 \times L1 \times \tan\beta).$$

When a height of the main body is H, an aspect ratio (H/D) of the main body may satisfy $0.05 < H/D < 20$.

H may satisfy $0.5 \ \mu m < H < 20 \ \mu m$.

D may satisfy $0.05 \ \mu m < D < 2 \ \mu m$.

The first inclined surface and the second inclined surface may include a same geometric shape.

$\beta$ may be about $52 \pm 5°$.

The height L1 may be about 100 nm or less.

In accordance with an aspect of the disclosure, a micro-LED includes a first semiconductor layer of a first type including an n-type or a p-type, the first semiconductor layer including a nanorod shape; a second semiconductor layer of a second type including the n-type or the p-type different from the first type, the second semiconductor layer facing the first semiconductor layer; and an active layer disposed between the first semiconductor layer and the second semiconductor layer, wherein the first semiconductor layer includes a main body; and an upper end connected to an upper part of the main body, wherein the upper end includes a first inclined surface; a second inclined surface; and a flat upper surface between the first inclined surface and the second inclined surface, wherein a width of the upper end becomes narrower in an upward direction away from the main body, and wherein when a thickness of the upper end in the upward direction is L1, an inclination angle between the flat upper surface and a surface extending parallel to a surface selected from the first inclined surface and the second inclined surface is $\beta$, and a width of the main body is D, a width D1 of the flat upper surface satisfies the following equation:

$$D1 = D - (2 \times L1 \times \tan\beta).$$

The active layer may include a first compound semiconductor layer.

The active layer may further include a second compound semiconductor layer on the first compound semiconductor layer.

The first compound semiconductor layer and the second compound semiconductor layer may include same materials with different composition ratios.

When a height of the main body is H, an aspect ratio (H/D) of the main body may satisfy $0.05 < H/D < 20$.

H may satisfy $0.5 \ \mu m < H < 20 \ \mu m$.

D may satisfy $0.05 \ \mu m < D < 2 \ \mu m$.

The first inclined surface and the second inclined surface may include a same geometric shape.

Exposed peripheral surfaces of the first semiconductor layer, the second semiconductor layer, and the active layer may be covered with an insulating film.

A pixel plate may include a plurality of pixel regions, wherein each of the plurality of pixel regions includes a first subpixel including a first micro-LED according to an above-noted aspect of the disclosure configured to emit a first light; a second subpixel including a second micro-LED according to an above-noted aspect of the disclosure configured to emit a second light; and a third subpixel including a third micro-LED according to an above-noted aspect of the disclosure configured to emit a third light, wherein the first micro-LED, the second micro-LED, and the third micro-LED each include a same configuration and a same shape, and wherein the first micro-LED, the second micro-LED, and the third micro-LED each include different materials.

Each of the first subpixel, the second subpixel, and the third subpixel may include respective two electrodes that are parallel and separated from each other, wherein the respective two electrodes are connected to each other by a corresponding micro-LED from among the first micro-LED, the second micro-LED, and the third micro-LED.

A number of micro-LEDs included in the first subpixel may be different from a number of micro-LEDs included in each of the second subpixel and the third subpixel.

The pixel plate may further include a plurality of partition walls provided between adjacent subpixels from among the first subpixel, the second subpixel, and the third subpixel.

A display device may include a backplane; a front panel facing the backplane; and a pixel plate according to an above-noted aspect of the disclosure disposed between the backplane and the front panel.

An electronic device may include a front panel; a rear panel facing the front panel; a pixel plate according to an above-noted aspect of the disclosure disposed between the front panel and the rear panel; and a battery in contact with the rear panel.

The rear panel may include a communication module, and a camera module may be connected to the rear panel.

The electronic device may further include a device main body; and bands connected to either side of the device main body, wherein the device main body includes a display area including the front panel, the rear panel, the pixel plate, and the battery, and wherein a camera, a microphone, and a speaker are provided around the display area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
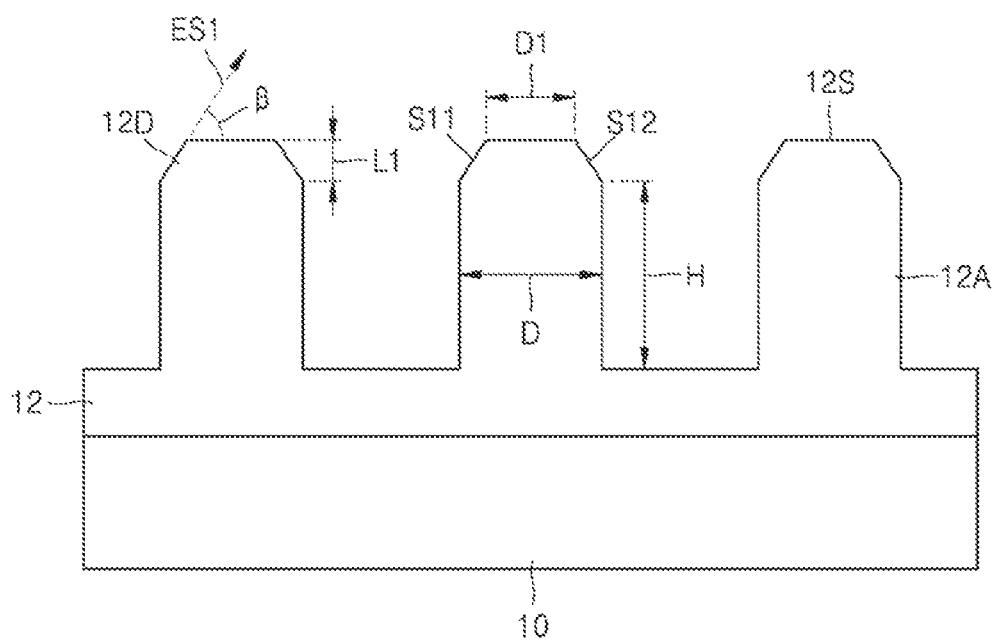
FIG. 1 is a cross-sectional view of a nanorod semiconductor layer according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The advantages, features, and methods of achieving the advantages may be clear when referring to the embodiments described below together with the drawings. However, embodiments may have different forms and should not be construed as being limited to the descriptions set forth herein. Rather, these embodiments are provided so that this disclosure will be thorough and complete, and will fully convey the scope of the disclosure to those of ordinary skill in the art. Embodiments will be defined by the appended claims. In the drawings, thicknesses of layers and regions may be exaggerated for convenience of explanation.

Terminologies used in the specification will be briefly described and the current embodiment will be described in detail.

Terminologies used herein are selected as commonly used by those of ordinary skill in the art in consideration of functions of the current embodiment, but may vary according to the technical intention, precedents, or a disclosure of a new technology. However, the terms may have different meanings according to the intention of one of ordinary skill in the art, and in this case, the meaning of the selected terms will be described in detail in the detailed description of the disclosure. Thus, the terms used herein should be defined based on the meaning of the terms together with the description throughout the specification.

It should be understood that, when a part "comprises" or "includes" an element in the specification, unless otherwise defined, it is not excluding other elements but may further include other elements.

Hereinafter, a nanorod semiconductor layer having a flat upper surface, a micro-LED using the micro-LED, a pixel plate including the same, and a display device and an electronic device including the pixel plate will be described in detail with reference to the accompanying drawings. In the drawings, thicknesses of layers and regions may be exaggerated for clarity of specification. The embodiments of the disclosure are capable of various modifications and may be embodied in many different forms. In the layer structure described below, when an element is referred to as being "on" or "above" another element, the element may be in direct contact with the other element or other intervening elements may be present. The electronic device may include a semiconductor device. In the drawings, like reference numerals refer to the like elements.

First, a nanorod semiconductor layer having a flat upper surface will be described. The flat upper surface may refer to as a flat top.

FIG. 1 shows a nanorod semiconductor layer according to an embodiment.

Referring to FIG. 1, a Group III-V material layer 12 is provided on a substrate 10. The substrate 10 may be a silicon substrate or a sapphire substrate, but may not be limited thereto. The Group III-V material layer 12 may cover an entire upper surface of the substrate 10. The Group III-V material layer 12 may be a doped material layer or an undoped material layer. In an example, the Group III-V material layer 12 may be a doped GaN layer or an undoped GaN layer. In the case of the doped GaN layer, the doped GaN layer may be a GaN layer doped with an N-type dopant. The Group III-V material layer 12 includes a nanorod semiconductor layer 12A+12D formed in a direction perpendicular to the upper surface of the substrate 10 and away from the upper surface of the substrate 10 (i.e., in an upward direction). The nanorod semiconductor layer 12A+12D includes a nanorod body 12A and an upper end 12D connected to an upper part of the nanorod body 12A. The width of the upper end 12D is gradually reduced as it goes upward. For convenience of explanation, the nanorod semiconductor layer 12A+12D is divided into the nanorod body 12A and the upper end 12D, but the nanorod body 12A and the upper end 12D may be a single body having the same material and composition without a physical boundary therebetween. The nanorod bodies 12A are separated at a given interval. The nanorod body 12A may have a given height H and a given diameter (i.e., width) D. The nanorod body 12A may have an aspect ratio, that is, a ratio H/D of the height H and the diameter D may be about 0.05<H/D<20. The nanorod body 12A may have a diameter D that satisfies the aspect ratio. In an example, the diameter D of the nanorod body 12A may be about 0.05 μm<D<2 μm. In addition, the nanorod body 12A may have a height H that satisfies the aspect ratio. In an example, the height H of the nanorod body 12A may be about 0.5 μm<H<20 μm.

The upper end 12D may be considered as a part grown from the nanorod body 12A or a part protruded from the nanorod body 12A. The upper end 12D includes an upper surface 12S and first and second inclined surfaces S11 and S12 on either side of the upper surface 12S. The first and second inclined surfaces S11 and S12 may be symmetrical about an axis extending in the upward direction with the upper surface 12S as the center. In an example, a geometric shape of the upper end 12D may be a hexagon when viewed in a plane. The first inclined surface S11 may have a given inclination angle β as shown in FIG. 1. The inclination angle β is an angle between a virtual inclined surface ES1 extending parallel to the first inclined surface S11 from the first inclined surface S11 and the upper surface 12S. The inclination angle R may be, for example, about 52±5°. Since the upper end 12D has a width gradually reducing as it goes upward, a width D1 of the upper surface 12S may be less than the width D of the nanorod body 12A. The width D1 of the upper surface 12S may satisfy the following Equation 1, wherein L1 represents a thickness of the upper end 12D.

$$D1 = D - (2 \times L1 \times \tan\beta) \qquad \text{<Equation>}$$

Figure 2:
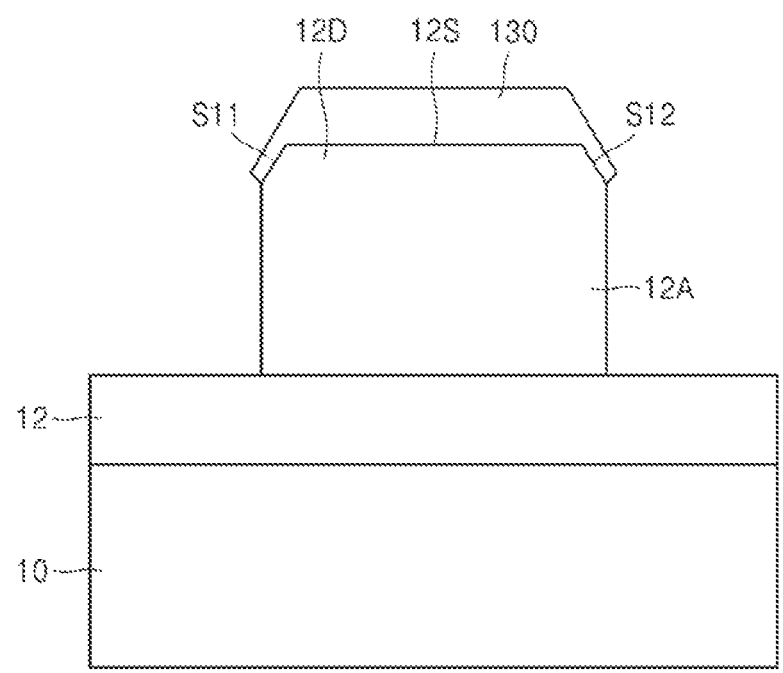
FIG. 2 is a cross-sectional view of a semiconductor layer further provided on an upper end of the nanorod semiconductor layer in FIG. 1, according to an embodiment.

FIG. 2 shows a case when a semiconductor layer 130 is provided on the nanorod semiconductor layer 12A+12D of FIG. 1. The semiconductor layer 130 may be a compound semiconductor layer. The semiconductor layer 130 covers the upper surfaces 12S and the first and second inclined surfaces S11 and S12 of the upper end 12D. Since an upper surface 12S of the upper end 12D is flat and the semiconductor layer 130 is present on the upper surface 12S, the semiconductor layer 130 grown on the upper surface 12S of the upper end 12D may have a uniform thickness and composition. The semiconductor layer 130 may be used as a light-emitting layer. In an example, the semiconductor layer 130 may be an InGaN layer, but is not limited thereto. When the semiconductor layer 130 is an InGaN layer, since the semiconductor layer 130 is grown on the flat upper surface 12S of the nanorod semiconductor layer 12A+12D, the distribution uniformity of indium In in the semiconductor layer 130 may be greater than when the semiconductor layer 130 is grown on a non-flat surface. Accordingly, when the semiconductor layer 130 is used as a light-emitting layer, a resultant product including the nanorod semiconductor layer 12A+12D and the semiconductor layer 130 according to an embodiment may be used for high efficiency light-emitting nanorods. An upper surface of the semiconductor layer 130 may also be flat.

In an example, the semiconductor layer 130 may include a sequentially stacked plurality of compound semiconductor layers. The plurality of compound semiconductor layers may have different physical properties from each other. In an example, the semiconductor layer 130 may be a layer formed by sequentially growing first and second compound semiconductor layers having different lattice constants. As the lattice constants of the first and second compound semiconductor layers are different from each other, strain may appear in the semiconductor layer 130, and thus, defects may occur in the semiconductor layer 130, but since the semiconductor layer 130 is grown on the flat upper surface 12S of the nanorod semiconductor layer 12A+12D, the occurrence of defects in the semiconductor layer 130 may be prevented or reduced. The first and second compound semiconductor layers may have the same composition (i.e., the same materials) but may have different composition ratios. In an example, the first compound semiconductor layer may be an $In_xGa_yN_{(1-y-x)}$ layer (x<0.18, y>0.82), and the second compound semiconductor layer may be an $In_xGa_yN_{(1-y-x)}$ layer (x>0.25, y<0.75).

Figure 3:
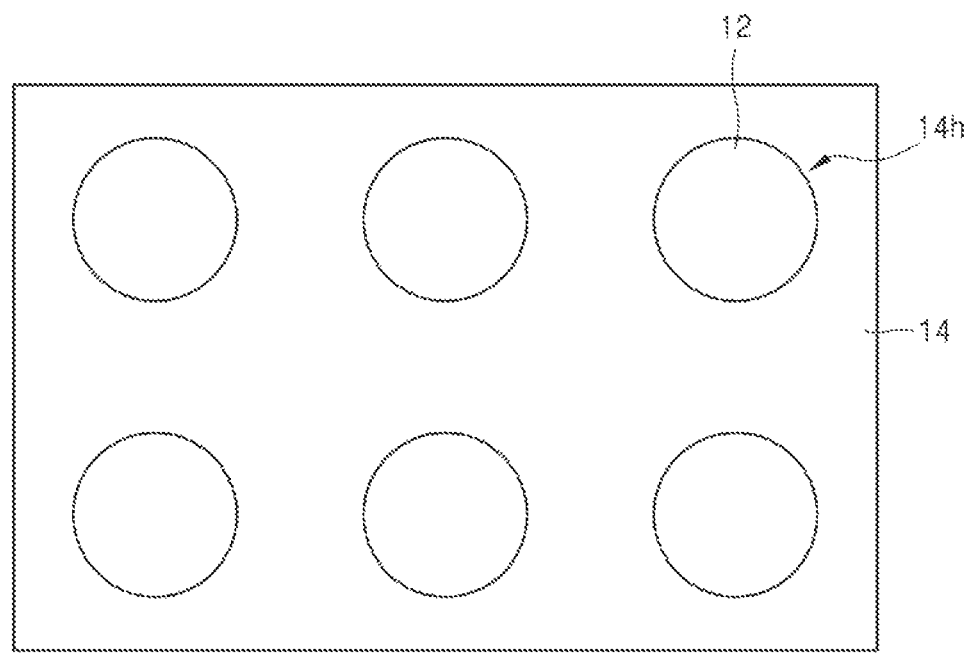
FIG. 3 is a plan view of a mask including a plurality of circular through-holes around a nanorod semiconductor layer according to an embodiment.

FIG. 3 shows an example of a mask 14 that defines an area in which the nanorod semiconductor layer 12A+12D described above will be formed.

Referring to FIG. 3, the mask 14 includes a plurality of through holes 14h. The plurality of through holes 14h are separated from each other and may form an array. The through hole 14h may be circular in a plan view, but may also be in other forms, for example, oval or polygonal.

Figure 4:
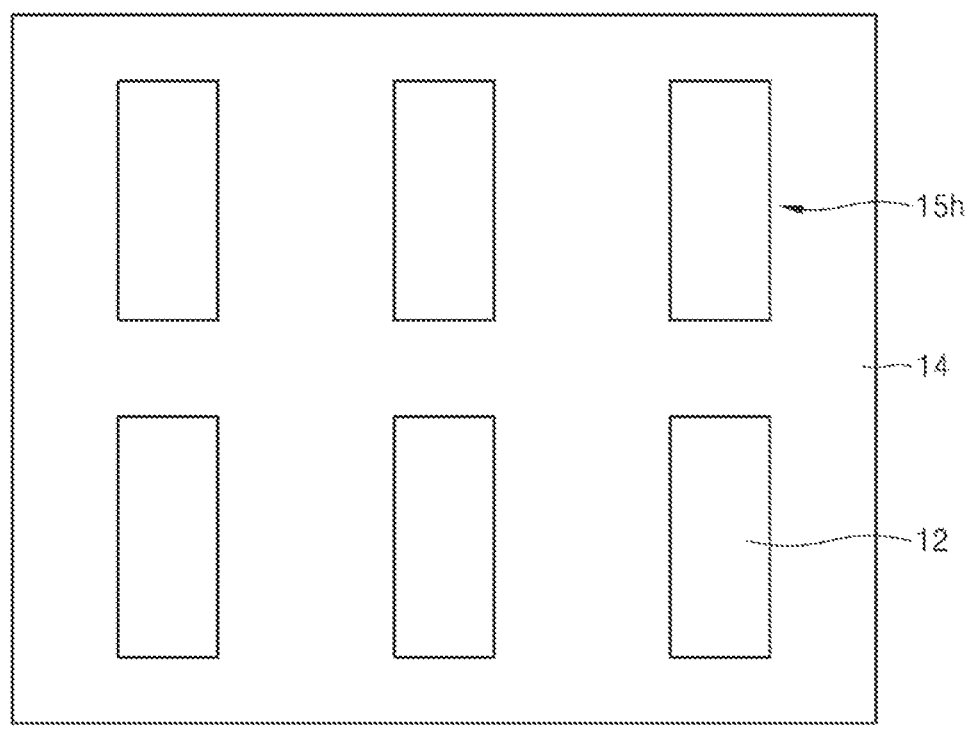
FIG. 4 is a plan view of a mask including a plurality of line-shaped through-holes around a nanorod semiconductor layer according to an embodiment.

Also, as shown in FIG. 4, the through hole 15h may be an elongated rectangular hole or a line-shaped hole. According to the shape of the mask 14, that is, according to the shape of the through hole 14h or 15h formed in the mask 14, various nanorod semiconductor layers may be formed, and thus, the nanorod semiconductor layer formed by using the mask 14 may be applied to a diffraction grating, photonic crystal, etc. by forming the through hole 14h or 15h formed in the mask 14 in a specific shape.

Figure 5:
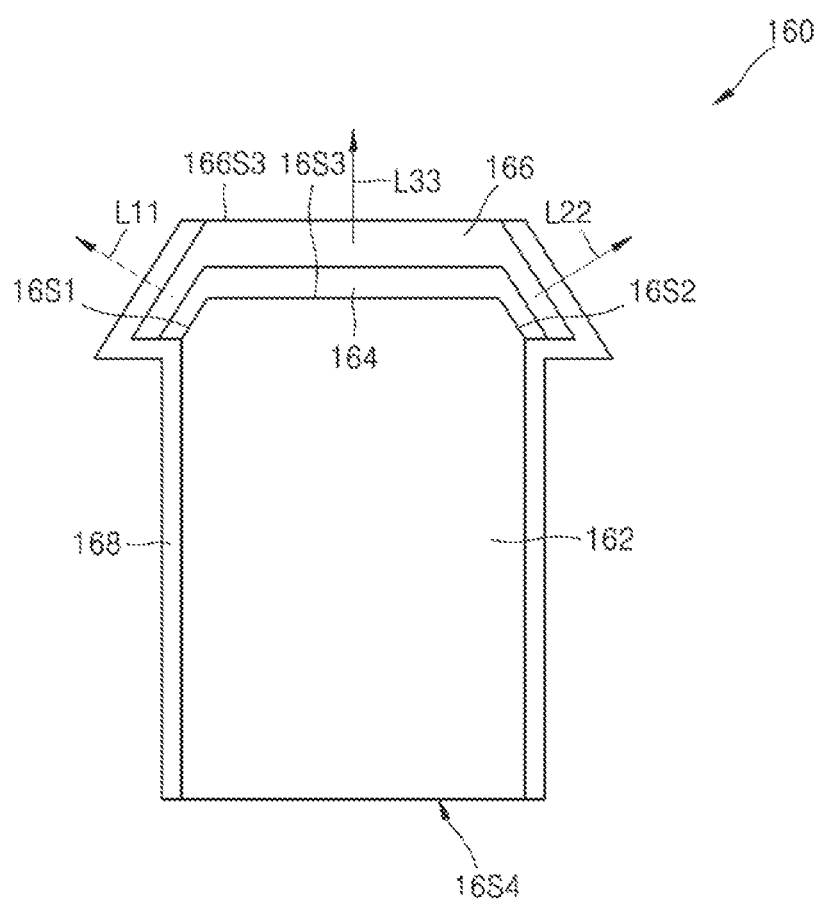
FIG. 5 is a cross-sectional view of a micro-LED using a nanorod structure according to an embodiment.

FIG. 5 shows a micro-LED 160 as an example of a light-emitting device using a nanorod structure according to an embodiment.

Referring to FIG. 5, the micro-LED 160 includes a first semiconductor layer 162 of a first type having a pillar-shape, an active layer 164, and a second semiconductor layer 166 of a second type. The first type may be, for example, an n-type. The second type may be, for example, a p-type. In other examples, the first and second types may be reversed. The first semiconductor layer 162, the active layer 164, and the second semiconductor layer 166 are sequentially stacked. In an example, the first semiconductor layer 162 may be a Group III-V compound semiconductor layer, for example, an n-GaN layer, but is not limited thereto. The second semiconductor layer 166 may be a Group III-V compound semiconductor layer, for example, a p-GaN layer, but is not limited thereto.

Other members that may stabilize the operation of the micro-LED 160, help stabilize light emission, or increase light emission efficiency may further be arranged between the first semiconductor layer 162 having a pillar shape, the active layer 164, and the second semiconductor layer 166. The first semiconductor layer 162 having a pillar shape may be only an example selected from materials that are used as an n-type semiconductor layer, for example, an n-type compound semiconductor layer of a micro-LED. The first semiconductor layer 162 having a pillar shape may be a nanorod semiconductor layer according to an embodiment, for example, a nanorod semiconductor layer including the nanorod body 12A and the upper end 12D of FIG. 1. The active layer 164 may be a layer that emits light due to recombination of holes and electrons, that is, a light-emitting layer. The active layer 164 may be a semiconductor layer having a multi-quantum well structure. Depending on the material of the active layer 164, light of various wavelengths may be emitted from the active layer 164. For example, depending on the material of the active layer 164, the active layer 164 may be a light-emitting layer that emits red light R, green light G, or blue light B. In one example, the active layer 164 may be an InGaN layer, but is not limited to this material. The active layer 164 may be a single layer or multiple layers. In an example, the active layer 164 may be a single layer compound semiconductor layer (InGaN). In an example, the active layer 164 may be a multi-layer compound semiconductor layer. For example, when the active layer 164 includes the first and second compound semiconductor layers (InGaN) sequentially stacked, the composition of each layer may be the same and the composition ratios may be different from each other. The active layer 164 covers an upper surface 16S3, which is flat, of the first semiconductor layer 162 and first and second inclined surfaces 16S1 and 16S2 of either side of the flat upper surface 16S3. The active layer 164 may be in direct contact with the upper surface 16S3 and the first and second inclined surfaces 16S1 and 16S2 of the first semiconductor layer 162. Since the upper surface 16S3 of the first semiconductor layer 162 having a pillar shape is flat, the composition and thickness of the active layer 164 on the upper surface 16S3 may be uniform. Portions of the active layer 164 formed on the first and second inclined surfaces 16S1 and 16S2 of the first semiconductor layer 162 may have inclined surfaces having the same inclination angles as those of the first and second inclined surfaces 16S1 and 16S2 within a measurement error range. On the first and second inclined surfaces 16S1 and 16S2 of the first semiconductor layer 162 having a pillar shape, the active layer 164 may have a uniform composition and thickness. Here, the thickness may be a thickness measured in a direction perpendicular to the first and second inclined surfaces 16S1 and 16S2. Since the composition and thickness of the active layer 164 formed on the upper surface 16S3 and the first and second inclined surfaces 16S1 and 16S2 of the first semiconductor layer 162 having a pillar shape are uniform, light L33 of good quality may be uniformly emitted in a direction perpendicular to the upper surface of the active layer 164, and also, light L11 and L22 of good quality may be uniformly emitted in both lateral directions of the active layer 164 (i.e., in both directions perpendicular to the first and second inclined surfaces 16S1 and 16S2). The upper surface and both sides of the active layer 164 are covered with the second semiconductor layer 166. In an example, the second semiconductor layer 166 may cover an entire upper surface and entire side surfaces of the active layer 164 and may be in direct contact with the upper surface and the side surfaces of the active layer 164. The thickness of the second semiconductor layer 166 may be uniform on the upper surface of the active layer 164. The thickness of the second semiconductor layer 166 may be uniform on both inclined surfaces of the active layer 164. On both inclined surfaces of the active layer 164, the second semiconductor layer 166 may have inclined surfaces that are parallel to both inclined surfaces of the active layer 164 or are inclined at the same angle within a measurement error range. An upper surface 166S3 of the second semiconductor layer 166 may be parallel to or substantially parallel to the upper surface of the active layer 164. The "substantially parallel" may denote that the two upper surfaces are parallel to each other within a measurement error range such that any angle formed between the two upper surfaces has no effect on light emission efficiency. The second semiconductor layer 166 may be one selected from material layers that may be used as a p-type semiconductor layer, for example, a material layer that may be used as a p-type compound semiconductor layer of an LED.

As may be seen in FIG. 5, the micro-LED 160 according to an embodiment has a structure in which the active layer 164 and the second semiconductor layer 166 sequentially cover the upper surface 16S3 and the side surfaces 16S1 and 16S2 of the upper end of the first semiconductor layer 162 having a pillar shape. Therefore, the micro-LED 160 is similar in shape to a cap on the top of a pillar. The pillar portion of the first semiconductor layer 162 may perform as a pillar of the micro-LED 160. Except when it is necessary to distinguish, for convenience, the upper surface 166S3 and the inclined sides of the second semiconductor layer 166 are considered as an upper surface and sides of the micro-LED 160. Also, a bottom surface 16S4 of the first semiconductor layer 162 is also considered as the bottom surface of the micro-LED 160 for convenience, except when it is necessary to specifically distinguish.

The entire exposed surface (i.e., the peripheral surfaces) of the micro-LED 160 between the upper surface 166S3 and the bottom surface 16S4 of the micro-LED 160 may be covered with an insulating film 168. The insulating layer 168 may be in close contact with the entire exposed surface of the micro-LED 160 between the upper surface 166S3 and the bottom surface 16S4 of the micro-LED 160. The upper surface 166S3 and the bottom surface 16S4 of the micro-LED 160 are exposed. In an example, at least a portion of both sides of the upper surface 166S3 of the micro-LED 160 may also be exposed.

Figure 6:
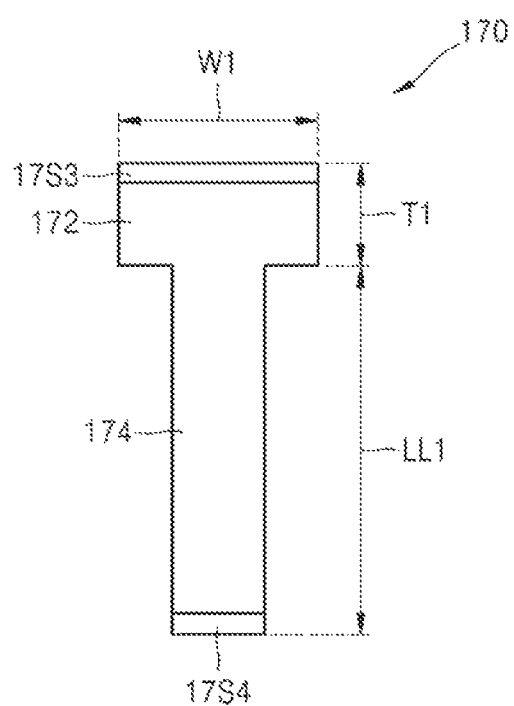
FIG. 6 is a cross-sectional view of an equivalent micro-LED showing the micro-LED shown in FIG. 5.

FIG. 6 shows an equivalent micro-LED 170 representing the micro-LED 160 shown in FIG. 5. In the drawings below, for convenience of illustration, the equivalent micro-LED 170 of FIG. 6 is used.

Referring to FIG. 6, the equivalent micro-LED 170 includes a pillar 174 and a head 172. The head 172 is connected to the pillar 174 at the top of the pillar 174 to form one body. The head 172 represents the first semiconductor layer 162, the active layer 164, and the second semiconductor layer 166 sequentially stacked in the micro-LED 160 of FIG. 5. The pillar 174 represents a pillar portion of the first semiconductor layer 162. The length LL1 of the pillar 174 is greater than the length T1 of the head 172 measured in the longitudinal direction of the pillar 174, and is also greater than the width W1 of the head 172. Reference numeral 17S3 indicates the exposed upper surface 166S3 of the micro-LED 160, and 17S4 indicates the exposed bottom surface 16S4 of the micro-LED 160.

Figure 7:
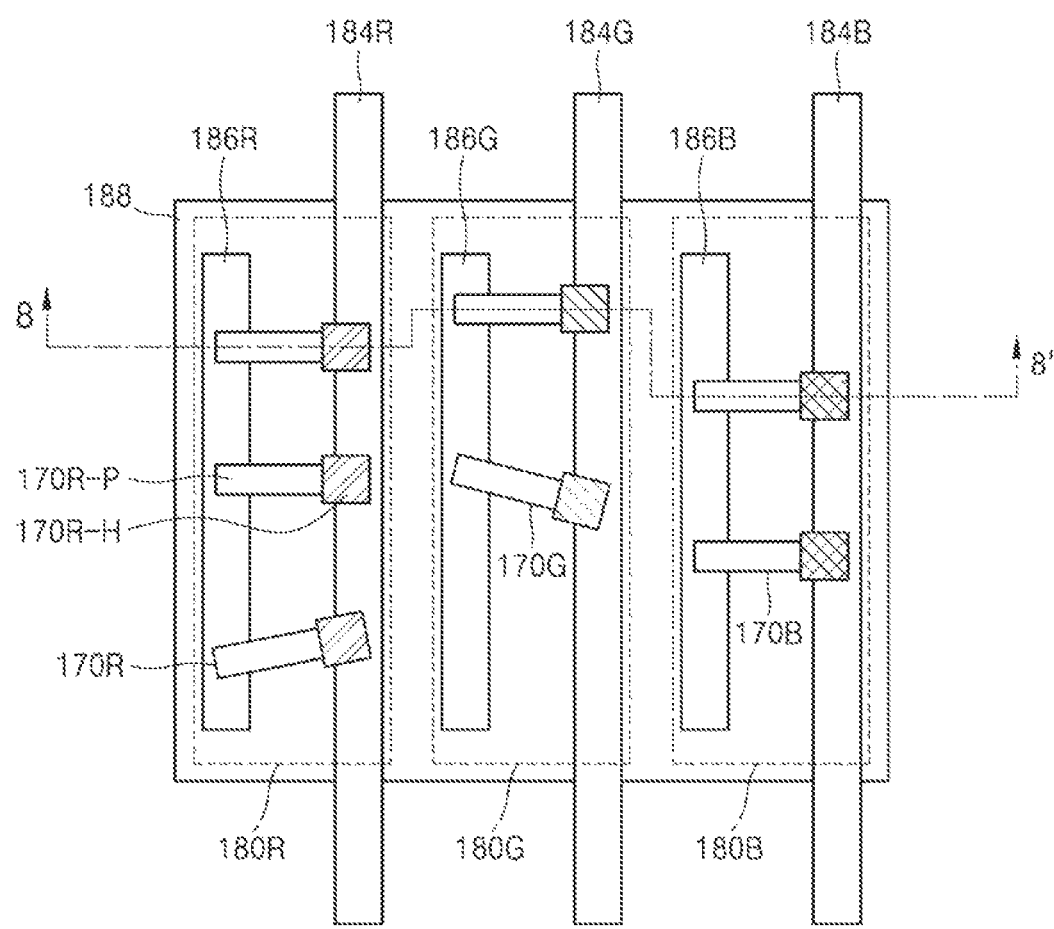
FIG. 7 is a plan view of a unit pixel including a micro-LED according to an embodiment.

FIG. 7 is a plan view of a display device including a micro-LED according to an embodiment. FIG. 7 shows a display device 180 at one pixel level.

Referring to FIG. 7, the display device 180 may be a television (TV) or a portable electronic device capable of displaying an image.

The display device 180 includes first to third subpixels 180R, 180G, and 180B. The first to third subpixels 180R, 180G, and 180B are aligned parallel to each other. In one example, the first subpixel 180R may emit red light R, the second subpixel 180G may emit green light G, and the third subpixel 180B may emit blue light B. The first subpixel 180R includes a first electrode 186R and a first common electrode 184R that are separated and parallel to each other. The second sub-pixel 180G includes a second electrode 186G and a second common electrode 184G that are separated and parallel to each other. The third sub-pixel 180B includes a third electrode 186B and a third common electrode 184B that are separated and parallel to each other. The first to third common electrodes 184R, 184G, and 184B may extend to other adjacent pixels. First micro-LEDs 170R are disposed between the first electrode 186R and the first common electrode 184R of the first sub-pixel 180R. Three first micro-LEDs 170R are disposed between the first electrode 186R and the first common electrode 184R, but the number of the first micro-LEDs 170R disposed between the first electrode 186R and the first common electrode 184R may be one or more. The configuration and shape of the first micro-LEDs 170R may be the same as those of the micro-LED 170 of FIG. 6. In an example, the first micro-LED 170R may be a micro-LED emitting red light. A head 170R-H of the first micro-LED 170R is connected to the first common electrode 184R, and a pillar 170R-P is connected to the first electrode 186R. The connection between the first micro-LED 170R, the first electrode 186R, and the first common electrode 184R may be achieved through metallization. In the metallization process, an exposed portion (upper surface) of the head 170R-H and a corresponding portion of the first common electrode 184R may be connected by covering with a conductive material (e.g., a metal), and an exposed portion (bottom surface) of the pillar 170R-P and a corresponding portion of the first electrode 186R may also be connected by covering with a conductive material.

Second micro-LEDs 170G are disposed between the first electrode 186G and the first common electrode 184G of the second sub-pixel 180G. The configuration and shape of the second micro-LEDs 170G may be the same as those of the micro-LED 170 of FIG. 6. In an example, the layer structure or shape of the second micro-LEDs 170G may be the same as those of the first micro-LED 170R except that the second micro-LEDs 170G may emit green light. Two second micro-LEDs 170G are arranged between the first electrode 186G and the first common electrode 184G, but the number of the second micro-LEDs 170G is not limited to two, and one or more second micro-LEDs 170G may be arranged. The connection relationship between the second micro-LED 170G, the second electrode 186G, and the second common electrode 184G may be the same as the connection relationship between the first micro-LED 170R, the first electrode 186R, and the first common electrode 184R.

In the third subpixel 180B, third micro-LEDs 170B are disposed between the third electrode 186B and the third common electrode 184B. Two third micro-LEDs 170B are arranged between the third electrode 186B and the third common electrode 184B, but the number of the third micro-LEDs 170B is not limited to two, and one or more (e.g., three, four, or five or more) may be arranged. The configuration and shape of the third micro-LED 170B may be the same as those of the micro-LED 170 of FIG. 6. In an example, the layer structure or shape of the third micro-LEDs 170B may be the same as those of the first and second micro-LEDs 170R and 170G except that the third micro-LEDs 170G may emit blue light. The connection relationship between the third micro-LED 170B, the third electrode 186B, and the third common electrode 184B may be the same as the connection relationship between the first micro-LED 170R and the first electrode 186R and the first common electrode 184R.

The first to third common electrodes 184R, 184G, and 184B may include a reflective material to reflect light emitted from the micro-LEDs 170R, 170G, and 170B upward. For example, the first to third common electrodes 184R, 184G, and 184B may include Ag, Au, Al, Cr, or Ni, or an alloy of any two or more of these materials.

The first to third common electrodes 184R, 184G, and 184B may be ground lines. Also, there may be partition walls 194 (refer to FIG. 8) for preventing optical interference between the first to third subpixels 180R, 180G, and 180B.

Figure 8:
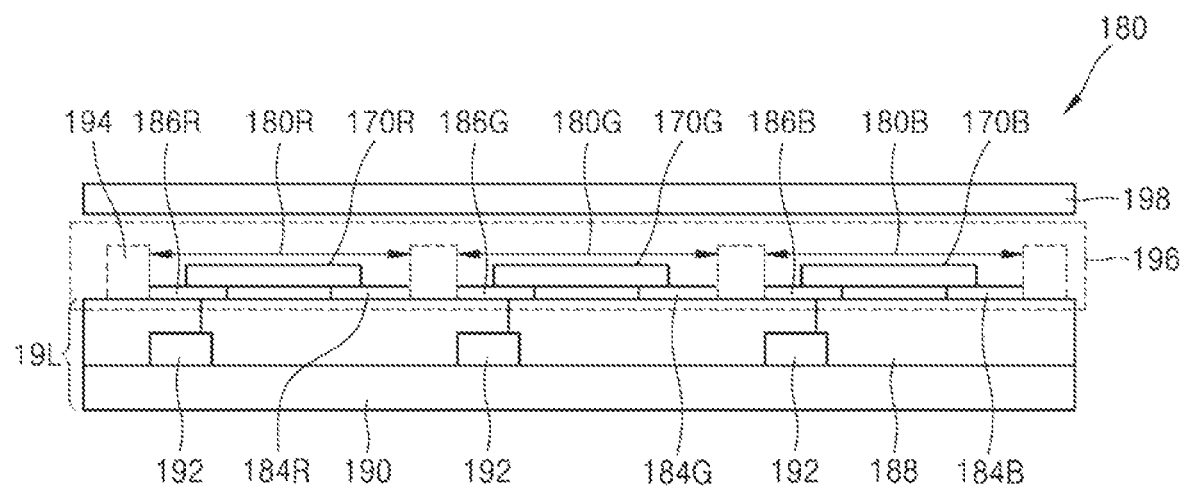
FIG. 8 is a cross-sectional view taken along a line 8-8' in FIG. 7

FIG. 8 is a cross-sectional view taken along a line 8-8' in FIG. 7.

Referring to FIG. 8, a plurality of driving elements 192 are present on a substrate 190. In an example, the substrate 190 may be a glass substrate, a sapphire substrate, or a silicon substrate coated with an oxide film. The plurality of driving elements 192 may be arranged in one-to-one correspondence to the first to third subpixels 180R, 180G, and 180B. In other words, a single driving element 192 may correspond to a single subpixel. A respective driving element 192 is arranged between each of the subpixels 180R, 180G, 180B and the substrate 190. The driving element 192 may drive the first to third micro-LEDs 170R, 170G, and 170B. In an example, the driving element 192 may be a thin film transistor. A drain of the thin film transistor 192 under the first subpixel 180R is connected to the first electrode 186R. A drain of the thin film transistor 192 under the second sub-pixel 180G is connected to the second electrode 186G. A drain of the thin film transistor 192 under the third sub-pixel 180B is connected to the third electrode 186B. The plurality of driving elements 192 may be provided in an array shape on a side or both sides of a pixel region of the substrate 190. In addition to the driving element 192, elements for operating and controlling of a micro-LED display may be present on the substrate 190. The substrate 190, the driving element 192, and an interlayer insulating layer 188 may be collectively referred to as a backplane 19L, and only the substrate 190 and the driving element 192 may be collectively referred to as a backplane. The backplane 19L may include all elements and circuits arranged on the substrate 190 in addition to the driving element 192. The driving element 192 is covered with the interlayer insulating layer 188. A surface of the interlayer insulating layer 188 is flat, and the first to third subpixels 180R, 180G, and 180B are provided thereon. For convenience, the first to third subpixels 180R, 180G, and 180B formed on the interlayer insulating layer 188 are collectively referred to as a pixel plate 196. The pixel plate 196 may also be represented by a pixel layer.

Accordingly, the display device 180 illustrated in FIG. 8 includes the sequentially stacked backplane 19L and the pixel plate 196. The display device 180 may further include a transparent front panel 198 on the pixel plate 196. The transparent front panel 198 may include an anti-reflection film attached to an outer surface thereof.

Figure 9:
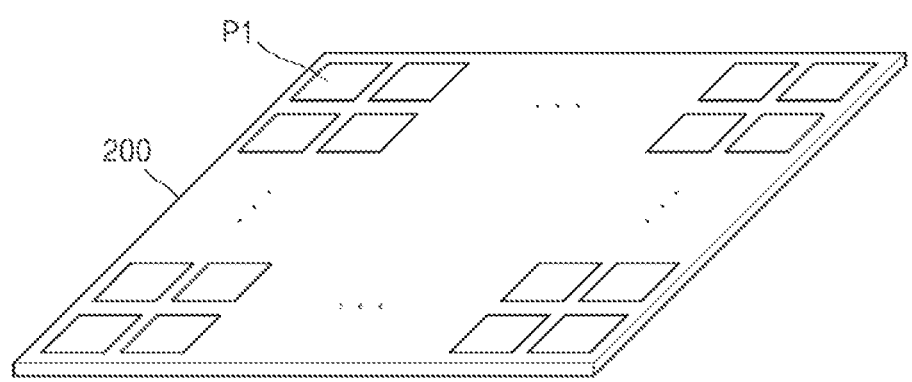
FIG. 9 is a perspective view of a pixel plate including a plurality of pixels according to an embodiment.

FIG. 9 shows an overall view of a pixel plate 200 included in a display device according to an embodiment.

Referring to FIG. 9, the pixel plate 200 includes a plurality of unit pixel plates P1. The plurality of unit pixel plates P1 are arranged in horizontal and vertical directions. Each unit pixel plate P1 may correspond to one pixel region. Each unit pixel plate P1 may be the pixel plate 196 described with reference to FIG. 8. The pixel plate 200 may have flexibility. Accordingly, the pixel plate 200 may be bent or folded.

Figure 10:
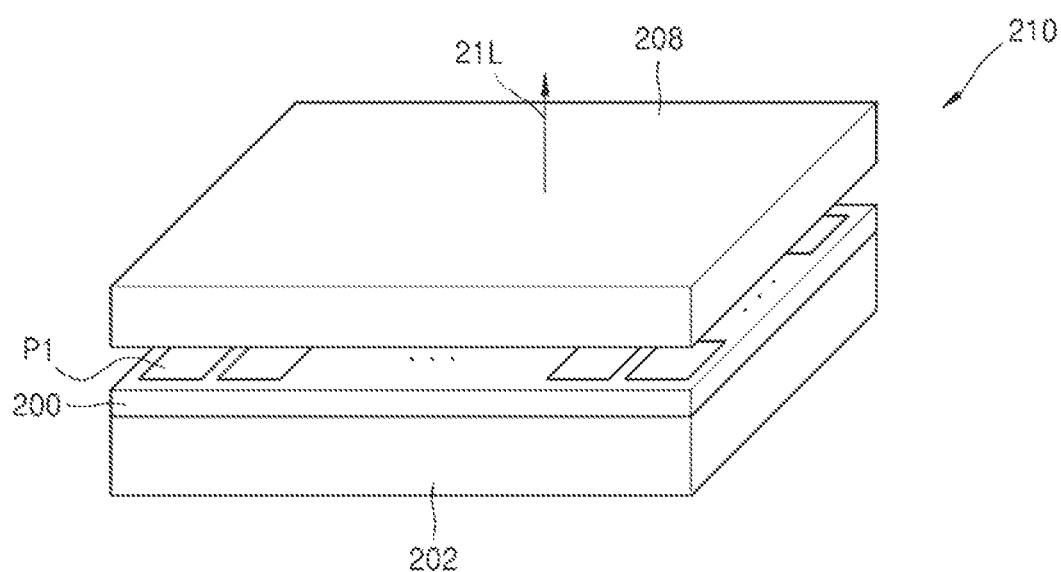
FIG. 10 is a perspective view of a display device including a pixel plate according to an embodiment.

FIG. 10 shows a display device 210 including the pixel plate 200 of FIG. 9.

Referring to FIG. 10, the display device 210 includes a backplane 202, a pixel plate 200, and a transparent front panel 208. The backplane 202 may include a circuit unit in which elements for driving the display device 210 are mounted. The circuit unit may include a semiconductor element, for example, a TFT or a capacitor etc. for driving the pixel plate 200. The transparent front panel 208 may include a plate transparent to light, and an anti-reflection film may be provided on a surface thereof. The display device 210 may be an LED display device. In an example, the display device 210 may constitute a display area of an electronic device having an image display area or may be included in the display area. Reference numeral 21L indicates light (e.g., an image) emitted through the transparent front panel 208.

Figure 11:
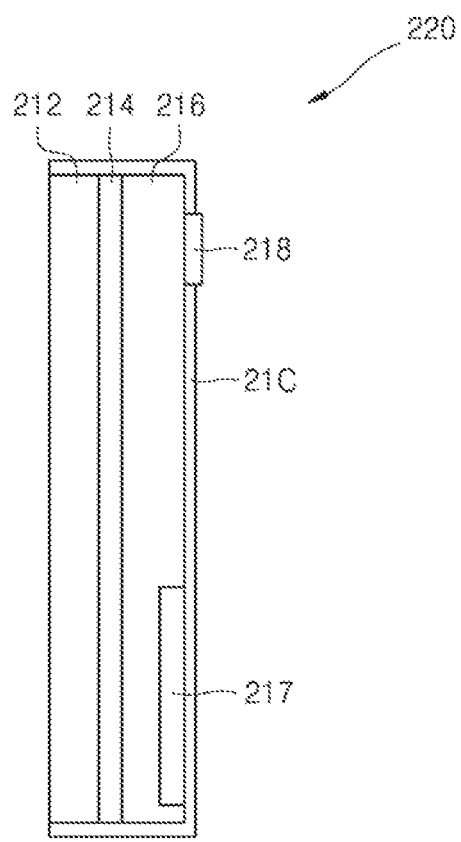
FIG. 11 is a cross-sectional view of an electronic device having a display area including a pixel plate according to an embodiment.

FIG. 11 shows an electronic device 220 including a pixel plate according to an embodiment. The electronic device 220 may be a portable electronic device that may be carried by a user. The electronic device 220 has an image display area and may include a communication function. In an example, the electronic device 220 may be a mobile phone or a tablet PC.

Referring to FIG. 11, the electronic device 220 may include a front panel 212, a pixel plate 214, a rear panel 216 and a battery 217. An image formed through the pixel plate 214 passes through the front panel 212 and is delivered to the user. The front panel 212 may include a transparent plate (e.g., a glass plate). The pixel plate 214 may be the pixel plate 200 of FIG. 9. The rear panel 216 is disposed behind the pixel plate 214 and may face the front panel 212 with the pixel plate 214 therebetween. The rear panel 216 may include an element for driving the pixel plate 214 and may be a circuit board on which a module related to an overall operation and control of the electronic device 220 is mounted or may include such a circuit board. The battery 217 may be mounted on a portion of the rear panel 216. The battery 217 is used as operating power of the electronic device 220. A camera module 218 is provided on a side of the rear panel 216. Reference numeral 21C indicates a case that surrounds a portion of the front panel 212, the pixel plate 214, and the rear panel 216.

Figure 12:
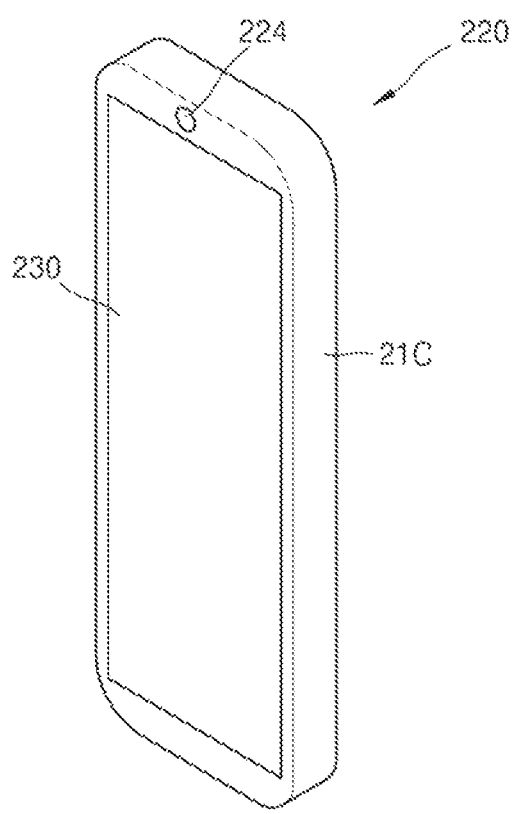
FIG. 12 is a perspective view showing an example when the electronic device of FIG. 11 is a mobile phone.

FIG. 12 is a three-dimensional view when the electronic device 220 of FIG. 11 is a mobile phone.

Referring to FIG. 12, the electronic device 220 has a display area 230 in front thereof. The display area 230 may be at least a part of a front surface of the front panel 212. Reference numeral 224 indicates a front camera disposed above the display area 230.

Figure 13:
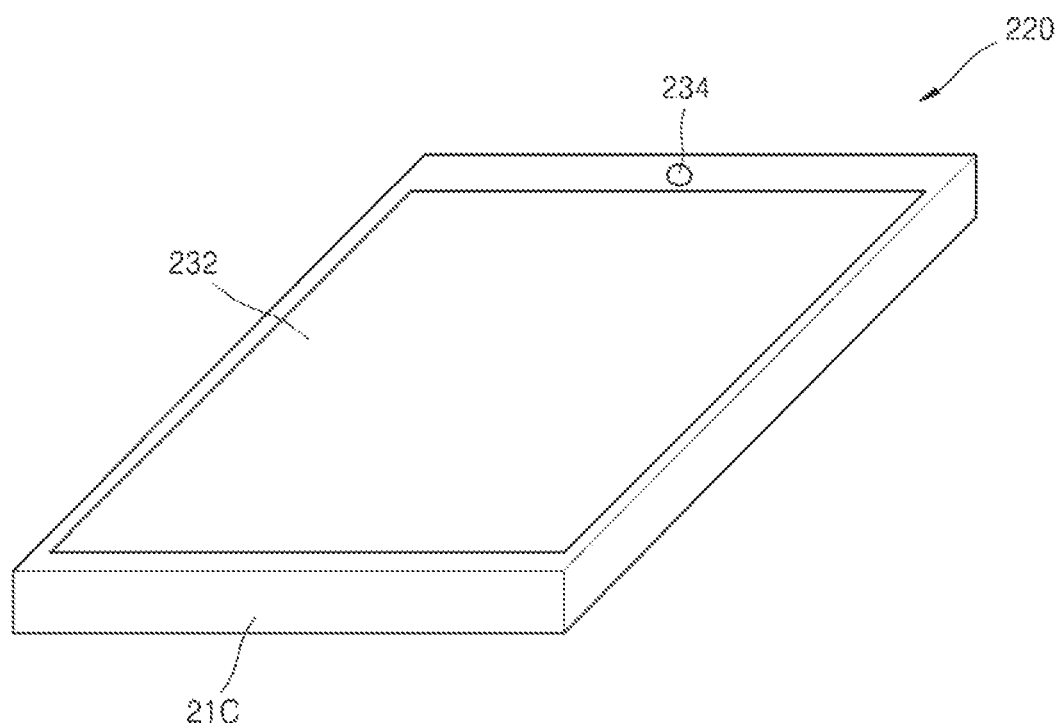
FIG. 13 is a perspective view showing an example when the electronic device of FIG. 11 is a tablet PC.

FIG. 13 is a three-dimensional view when the electronic device 220 of FIG. 11 is a tablet PC. Reference numeral 232 indicates an area in which an image is displayed. A front camera 234 is provided above the display area 232.

Figure 14:
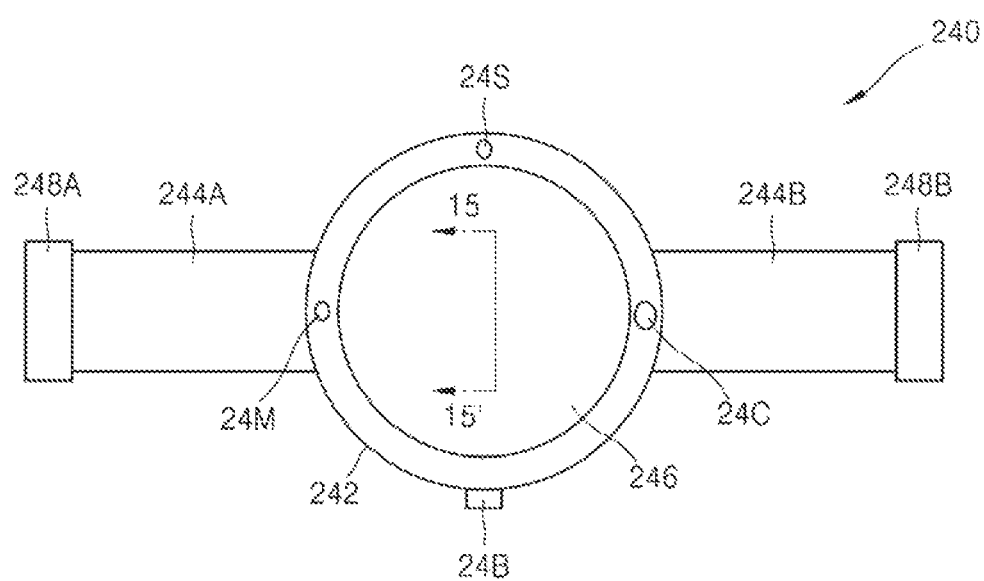
FIG. 14 is a plan view of a smart watch as an example of an electronic device including a pixel plate according to an embodiment.

FIG. 14 shows a smart watch 240 as an example of an electronic device including a pixel plate according to an embodiment. The smart watch 240 is worn on a wrist and is a type of electronic device that provides various functions (e.g., bio-signal measurement function, internet connection function, etc.) in addition to the clock and communication functions.

Referring to FIG. 14, the smart watch 240 may include a main body 242 (i.e., a device main body) having a display area 246 and first and second bands 244A and 244B that are respectively connected to either side of the main body 242 to attach the main body 242 to the wrist. The main body 242 itself may be regarded as a smart watch. The main body 242 is depicted in a circular shape for convenience, but may be a non-circular shape, for example, a rectangular shape. An operation state and/or operation mode of the smart watch 240 may be displayed on the display area 246 and an image may also be displayed on the display area 246. The selection and control of an operation mode of the smart watch 240 may be performed by touching a menu displayed on the display area 246, or may be performed by using a function selection controller 24B provided around the main body 242. A camera 24C, a microphone 24M, and a speaker 24S are provided around the display area 246 of the main body 242. The positions of the camera 24C, the microphone 24M, and the speaker 24S are relative and may vary, and are not limited to those illustrated in the drawings. A first fastening unit 248A is provided at the end of the first band 244A connected to one side of the main body 242. A second fastening unit 248B is provided at the end of the second band 244B connected to the other side of the main body 242. When the smart watch 240 is worn on the wrist, the first and second fastening units 248A and 248B may be coupled to each other.

Figure 15:
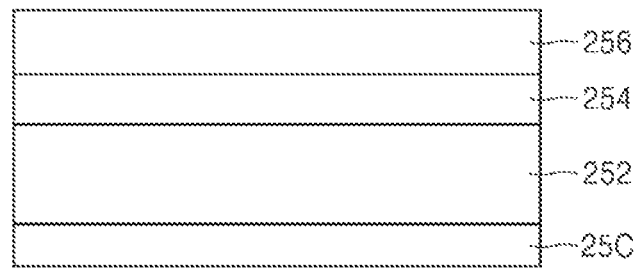
FIG. 15 is a cross-sectional view taken along a line 15-15' of FIG. 14.

FIG. 15 is a cross-sectional view taken along a line 15-15' of the display area 246 of the main body 242 of FIG. 14.

Referring to FIG. 15, a rear panel 252, a pixel plate 254, and a front panel 256 are sequentially stacked on a case 25C. The case 25C may be a lower case of the main body 242. The rear panel 252 may be a circuit unit (e.g., a circuit board) in charge of an overall operation and control of the main body 242 including driving and control of the pixel plate 254 or may include the circuit unit. The pixel plate 254 may be the pixel plate 200 illustrated in FIG. 9 or may include the pixel plate 200. The front panel 256 may include a plate transparent to light.

A nanorod structure according to an embodiment may have a substantially flat upper surface. Accordingly, in the case of a semiconductor layer grown on a nanorod structure according to an embodiment, the semiconductor layer may have a uniform thickness and a uniform composition. For example, when the semiconductor layer is an InGaN layer, an InGaN layer having a uniform thickness and a uniform composition of indium In may be obtained. Even when the semiconductor layer includes sequentially grown compound semiconductor layers having different lattice constants, a semiconductor layer having no defects or reduced defects may be obtained.

In addition, the nanorod structure according to an embodiment may have various shapes and may be applied to a diffraction grating or photonic crystal according to a given shape.

A micro-LED according to an embodiment is formed based on the nanorod structure, and thus, the uniformity of the thickness and composition of an active layer (light-emitting layer) may be increased. Accordingly, in the case of a micro-LED according to an embodiment, it is possible to emit light of uniform intensity while increasing light emission efficiency. Therefore, in the case of an electronic device including a pixel including the disclosed micro-LED, it is possible to display an image brighter and further clearly with relatively low power.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A nanorod semiconductor layer comprising:
   a main body; and
   an upper end connected to an upper part of the main body,
   wherein the upper end comprises:
      a first inclined surface;
      a second inclined surface; and
      a flat upper surface between the first inclined surface and the second inclined surface,
   wherein when a thickness of the upper end in the upward direction is L1, an inclination angle between the flat upper surface and a surface extending parallel to a surface selected from the first inclined surface and the second inclined surface is β, and a width of the main body is D, a width D1 of the flat upper surface satisfies the following equation:

$D1=D-(2\times L1\times\tan\beta)$.

2. The nanorod semiconductor layer of claim 1, wherein a width of the upper end becomes narrower in an upward direction away from the main body.

3. The nanorod semiconductor layer of claim 1, wherein when a height of the main body is H, an aspect ratio (H/D) of the main body satisfies 0.05<H/D<20.

4. The nanorod semiconductor layer of claim 3, wherein H satisfies 0.5 μm <H<20 μm.

5. The nanorod semiconductor layer of claim 3, wherein D satisfies 0.05 μm<D<2 μm.

6. The nanorod semiconductor layer of claim 3, wherein β is about 52±5°.

7. The nanorod semiconductor layer of claim 3, wherein the thickness L1 is about 100 nm or less.

8. A micro-light-emitting diode (LED) comprising:
   a first semiconductor layer of a first type comprising an n-type or a p-type, the first semiconductor layer comprising a nanorod shape;
   a second semiconductor layer of a second type comprising the n-type or the p-type different from the first type, the second semiconductor layer facing the first semiconductor layer;
   an active layer disposed between the first semiconductor layer and the second semiconductor layer,
   wherein the first semiconductor layer comprises:
      a main body; and
      an upper end connected to an upper part of the main body,
   wherein the upper end comprises
      a first inclined surface;
      a second inclined surface; and
      a flat upper surface between the first inclined surface and the second inclined surface, wherein when a thickness of the upper end in the upward direction is L1, an inclination angle between the flat upper surface and a surface extending parallel to a surface selected from the first inclined surface and the second inclined surface is β, and a width of the main body is D, a width D1 of the flat upper surface satisfies the following equation:

$D1=D-(2\times L1\times\tan\beta)$.

9. The micro-LED of claim 8, wherein the active layer comprises a first compound semiconductor layer.

10. The micro-LED of claim 9, wherein the active layer further comprises a second compound semiconductor layer on the first compound semiconductor layer.

11. The micro-LED of claim 10, wherein the first compound semiconductor layer and the second compound semiconductor layer comprise same materials with different composition ratios.

12. The micro-LED of claim 8, wherein a width of the upper end becomes narrower in an upward direction away from the main body.

13. The micro-LED of claim 8, wherein exposed peripheral surfaces of the first semiconductor layer, the second semiconductor layer, and the active layer are covered with an insulating film.

14. The micro-LED of claim 8, wherein when a height of the main body is H, an aspect ratio (H/D) of the main body satisfies 0.05<H/D<20.

15. A pixel plate comprising a plurality of pixel regions, wherein each of the plurality of pixel regions comprises:
   a first subpixel including a first micro-LED configured to emit a first light;
   a second subpixel including a second micro-LED configured to emit a second light; and
   a third subpixel including a third micro-LED configured to emit a third light,
   wherein each of the first micro-LED, the second micro-LED, and the third micro-LED comprises:
      a first semiconductor layer of a first type comprising an n-type or a p-type, the first semiconductor layer comprising a nanorod shape;
      a second semiconductor layer of a second type comprising the n-type or the p-type different from the first type, the second semiconductor layer facing the first semiconductor layer; and
      an active layer disposed between the first semiconductor layer and the second semiconductor layer,
   wherein the first semiconductor layer comprises:
      a main body; and
      an upper end connected to an upper part of the main body,
   wherein the upper end comprises
      a first inclined surface;
      a second inclined surface; and
      a flat upper surface between the first inclined surface and the second inclined surface,
   wherein when a thickness of the upper end in the upward direction is L1, an inclination angle between the flat upper surface and a surface extending parallel to a surface selected from the first inclined surface and the second inclined surface is $\beta$, and a width of the main body is D, a width D1 of the flat upper surface satisfies the following equation:

$$D1 = D - (2 \times L1 \times \tan\beta).$$

wherein the first micro-LED, the second micro-LED, and the third micro-LED each comprise a same configuration and a same shape, and wherein the first micro-LED, the second micro-LED, and the third micro-LED each comprise different materials.

16. The pixel plate of claim 15, wherein a width of the upper end becomes narrower in an upward direction away from the main body.

17. The pixel plate of claim 15, wherein each of the first subpixel, the second subpixel, and the third subpixel comprises:

two electrodes that are parallel and separated from each other, and wherein the respective two electrodes are connected to each other by a corresponding micro-LED from among the first micro-LED, the second micro-LED, and the third micro-LED.

18. The pixel plate of claim 15, wherein a number of micro-LEDs included in the first subpixel is different from a number of micro-LEDs included in each of the second subpixel and the third subpixel.

* * * * *